US008624226B2

(12) United States Patent
Lee et al.

(10) Patent No.: US 8,624,226 B2
(45) Date of Patent: *Jan. 7, 2014

(54) ORGANIC LIGHT EMITTING DEVICE AND METHOD OF FABRICATING THE SAME

(75) Inventors: Seok-Woon Lee, Tainan County (TW); Sung-Soo Park, Tainan County (TW); Biing-Seng Wu, Tainan County (TW)

(73) Assignee: Chimei Innolux Corporation, Miao-Li County (TW)

( * ) Notice: Subject to any disclaimer, the term of this patent is extended or adjusted under 35 U.S.C. 154(b) by 1311 days.

This patent is subject to a terminal disclaimer.

(21) Appl. No.: 11/695,804

(22) Filed: Apr. 3, 2007

(65) Prior Publication Data

US 2007/0235730 A1    Oct. 11, 2007

(30) Foreign Application Priority Data

Apr. 7, 2006   (TW) .............................. 95112521 A (51) Int. Cl.
*H01L 27/32* (2006.01)
*H01L 51/52* (2006.01)

(52) U.S. Cl.
USPC ............... 257/40; 257/E51.019; 257/E51.02; 313/503

(58) Field of Classification Search
USPC ................ 257/59, 72, 40, E51.02, E51.018, 257/E51.019, E51.001–E51.052; 345/76, 345/80; 313/498–512
See application file for complete search history.

(56) References Cited

U.S. PATENT DOCUMENTS

| 5,620,800 | A | * | 4/1997 | De Leeuw et al. ............ 428/469 |
| 5,620,880 | A | * | 4/1997 | Sloma et al. ............ 435/252.31 |
| 6,870,197 | B2 | | 3/2005 | Park et al. |
| 7,064,350 | B2 | | 6/2006 | Park |
| 7,321,134 | B2 | * | 1/2008 | Yoo ................................. 257/40 |
| 7,531,833 | B2 | | 5/2009 | Kim et al. |
| 7,932,520 | B2 | * | 4/2011 | Lee et al. ........................ 257/72 |
| 2002/0180664 | A1 | | 12/2002 | Tomida et al. |
| 2004/0097161 | A1 | | 5/2004 | Gourlay |
| 2004/0183465 | A1 | | 9/2004 | Jang |
| 2005/0140287 | A1 | * | 6/2005 | Ko ............................... 313/506 |

(Continued)

FOREIGN PATENT DOCUMENTS

| CN | 1638557 A | 7/2005 |
| CN | 1761371 A | 4/2006 |

(Continued)

OTHER PUBLICATIONS

Khalifa, M.B., et al. "Hole Injection and Transport in ITO/PEDOT/PVK/Al Diodes." Mat. Sci. & Eng. V, vol. 21 (2002): pp. 277-282.*

(Continued)

*Primary Examiner* — Steven J Fulk
*Assistant Examiner* — Eric Ward
(74) *Attorney, Agent, or Firm* — Lowe Hauptman & Ham, LLP (57) ABSTRACT

An organic light emitting device (OLED) is formed by assembling a first substrate and a second substrate. The second substrate includes several sub-pixels. The first substrate includes several transistors electrically connected to each other and, for each subpixel, a first connecting electrode electrically connected to one of the transistors. Each subpixel includes a light-emitting region and a non light-emitting region. A second connecting electrode is formed in the non light-emitting region and electrically connected to the respective first connecting electrode.

13 Claims, 4 Drawing Sheets

(56) References Cited

U.S. PATENT DOCUMENTS

| | | |
|---|---|---|
| 2005/0247936 A1* | 11/2005 | Bae et al. .................. 257/59 |
| 2006/0049959 A1 | 3/2006 | Sanchez |
| 2006/0081854 A1* | 4/2006 | Kim et al. .................. 257/72 |
| 2006/0145602 A1* | 7/2006 | Yoo .......................... 313/504 |
| 2006/0181895 A1 | 8/2006 | Hu et al. |
| 2007/0222400 A1 | 9/2007 | Sanchez-Olea |
| 2007/0235730 A1 | 10/2007 | Lee et al. |
| 2007/0235740 A1* | 10/2007 | Lee et al. .................. 257/79 |
| 2007/0252535 A1 | 11/2007 | Fukumoto et al. |
| 2008/0013001 A1 | 1/2008 | Jang et al. |

FOREIGN PATENT DOCUMENTS

| | | |
|---|---|---|
| EP | 1777575 A2 | 4/2007 |
| KR | 20060131015 A | 12/2006 |
| KR | 20070108986 A | 11/2007 |
| WO | 02/078101 A1 | 10/2002 |

OTHER PUBLICATIONS

Kim, J.S., et al. "Indium-Tin Oxide Treatments for Single- and Double-Layer Polymeric Light-Emitting Diodes: the Relation Between the Anode Physical, Chemical, and Morphological Properties and the Device Performance." J. Appl. Phys., vol. 84, No. 12 (Dec. 15, 1998): pp. 6859-6870.*

Shinar, J. Organic Light-Emitting Devices: A Survey. AIP Press, Springer: New York (2004): pp. 14.*

Chen, S.-A., et al. "White-Light Emission from Electroluminescence Diode with Polyaniline as the Emitting Layer." Synth. Met., vol. 82 (1996): pp. 207-210.*

* cited by examiner

ORGANIC LIGHT EMITTING DEVICE AND METHOD OF FABRICATING THE SAME

This application claims the benefit of Taiwan application Serial No. 095112521, filed Apr. 7, 2006, the entirety of which is incorporated herein by reference.

TECHNICAL FIELD

The disclosure relates in general to an organic light emitting device and a method of fabricating the same, and more particularly, to an organic light emitting device with high aperture ratio and high reliability, and a method of fabricating the same at high yield rate.

BACKGROUND

In a conventional organic light emitting device (OLED) and a method of fabricating the same, a thin film transistor (TFT) circuit and a light emitting device are disposed on a substrate orderly to form a display device. The display device is then sealed by a cover plate to prevent moisture from entering the display device. As a result, the light emitting device is not damaged by moisture. Because the fabrication processes of the TFT and the light emitting device are performed orderly on the same substrate, the yield rate of the substrate is obtained by multiplying the yield rate of the TFT by the yield rate of the light emitting device, which is far less than the individual yield rates. Recently, the TFT and the light emitting device are fabricated on different substrates to increase the yield rate, the aperture ratio and the reliability of the organic light emitting display. Then, the two substrates are assembled together to form the display.

Figure 1:
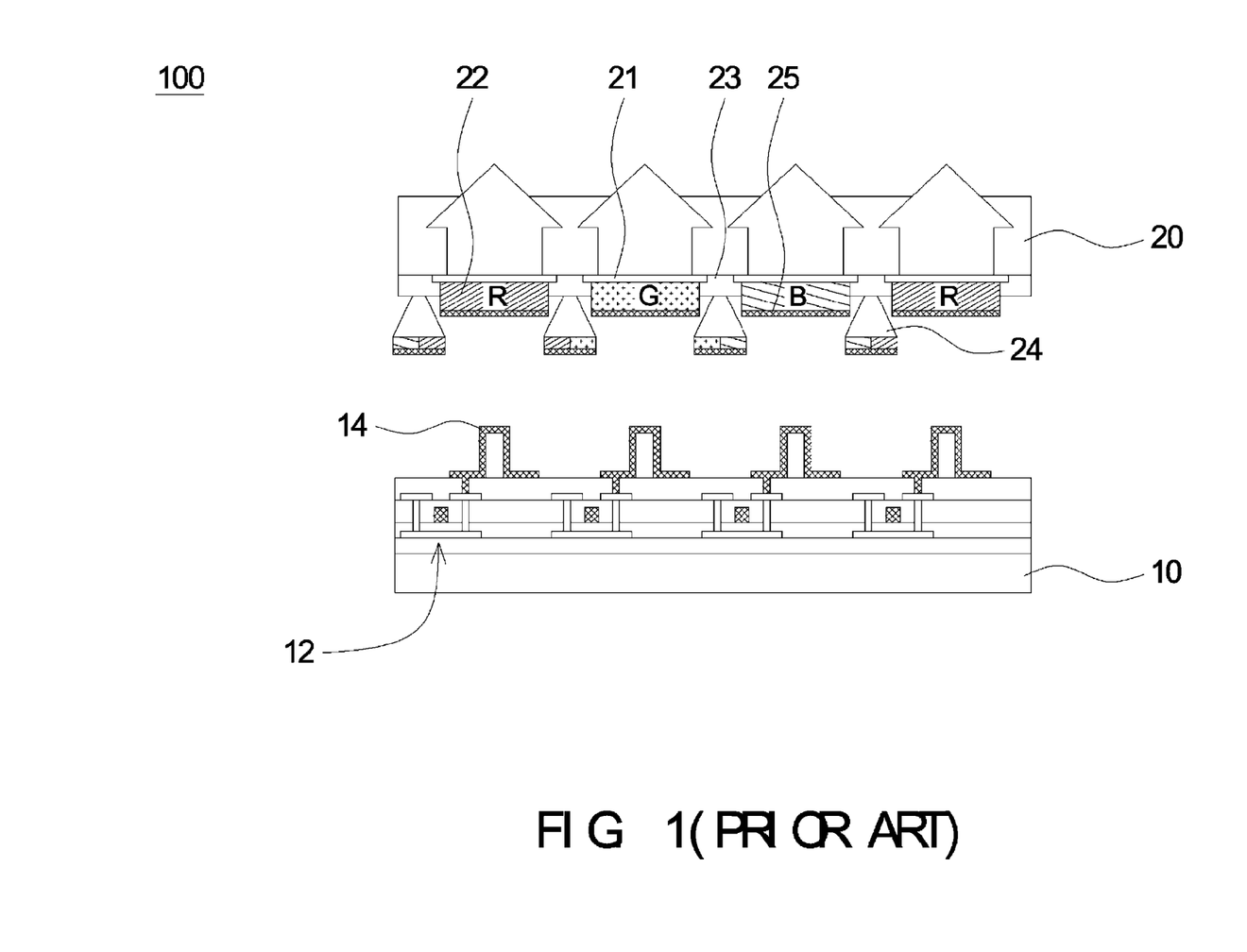
FIG. 1 is a cross-sectional, exploded view of a conventional organic light emitting device formed by assembling two substrates.

FIG. 1 is a cross-sectional, exploded view of a conventional organic light emitting device 100 formed by assembling two substrates. The organic light emitting device 100 includes a first substrate 10 (also known as a TFT substrate) and a second substrate 20 (also known as an OLED substrate). Several switching transistors (not shown in FIG. 1), driver transistors 12 and electrical connecting units 14 are formed on the first substrate 10. The electrical connecting units 14 are used for providing signals to the pixels on the second substrate 20. A light emitting device is formed on the second substrate 20 and includes, in each subpixel such as R, G, B, a first electrode 21, a light emitting layer (for example, for emitting red light, green light and blue light, respectively) 22, and a second electrode 25. An insulating layer 23 isolates the light emitting layer 22, the first electrode 21 and the second electrode 25 in each subpixel from the adjacent subpixel(s). A barrier wall 24 is used for isolating the second electrode 25 in each subpixel from the adjacent subpixel(s).

The organic light emitting display 100 is formed by assembling the first substrate 10 and the second substrate 20. The electrical connecting units 14 on the first substrate 10 are electrically connected to sources or drains of the driver transistors 12. Therefore, after the two substrates are assembled together, the sources or the drains of the driver transistors 12 on the first substrate 10 are electrically connected to the pixel electrodes, e.g., the second electrodes 25, of the second substrate 20 through the electrical connecting units 14, for providing the light emitting device of the second substrate 20 with image signals.

When the two substrates are assembled together, the electric connecting units 14 directly contact the light emitting device in light-emitting regions, designated at R, G and B in FIG. 1, of the second substrate 20. Therefore, the light emitting device is easily damaged, and the yield rate is lowered.

SUMMARY

There is a need for an organic light emitting device with high aperture ratio and high reliability, and a method of fabricating the same at high yield rate.

According to a first aspect of the present invention, an organic light emitting device (OLED) is provided. The OLED is formed by assembling a first substrate and a second substrate. The second substrate opposing the first substrate comprises a plurality of sub-pixels, each sub-pixel comprising a light emitting region and a non light-emitting region. Therein the first substrate comprises a plurality of transistors electrically connected to each other and corresponding to the sub-pixels of the second substrate, respectively, and, for each sub-pixel, a first connecting electrode electrically connected to the respective one of the transistors. The second substrate further comprises, for each sub-pixel, a second connecting electrode which is formed in the non light-emitting region and which is electrically connected to the respective first connecting electrode. In an embodiment, the second connecting electrode includes a conductive multilayer and an organic layer enclosed by the conductive multilayer.

According to a second aspect of the present invention, a method of fabricating an organic light emitting device from first and second substrates wherein the second substrate comprises plurality of sub-pixels, and the first substrate comprises a plurality of transistors electrically connected to each other and corresponding to the subpixels of the second substrate, respectively, is provided. For each sub-pixel, a first connecting electrode is formed on the first substrate to be electrically connected to the respective one of the transistors. Each sub-pixel includes a light-emitting region and a non light-emitting region. In the non light-emitting region of each sub-pixel, a second connecting electrode is formed. The first substrate and the second substrate are assembled together so as to directly contact and electrically connect the first connecting electrode with the respective second connecting electrode. In an embodiment, the second connecting electrode includes a conductive multilayer and an organic layer enclosed by the conductive multilayer.

According to a third aspect of the present invention, an organic light emitting device (OLED) formed by assembling a first substrate and a second substrate, the device comprising a plurality of sub-pixels, each sub-pixel comprising a light-emitting region and a non light-emitting region, is provided. The non light-emitting region of each subpixel includes a first connecting electrode formed on the first substrate and projecting towards the second substrate; and a second connecting electrode formed on the second substrate and comprising a conductive multilayer and an organic layer enclosed by the conductive multilayer. The second connecting electrode is in direct contact with and electrically connected to the first connecting electrode so as to electrically connect the first substrate and the second substrate.

Additional aspects and advantages of the disclosed embodiments are set forth in part in the description which follows, and in part are apparent from the description, or may be learned by practice of the disclosed embodiments. The aspects and advantages of the disclosed embodiments may also be realized and attained by means of the instrumentalities and combinations particularly pointed out in the appended claims.

BRIEF DESCRIPTION OF THE DRAWINGS

Embodiments of the invention will now be described, by way of example only, with reference to the accompanying drawings in which elements having the same reference numeral designations represent like elements throughout and in which.

DETAILED DESCRIPTION OF EMBODIMENTS

In the following detailed description, for purposes of explanation, numerous specific details are set forth in order to provide a thorough understanding of the embodiments. It will be apparent, however, that the embodiments may be practiced without these specific details. In other instances, well-known structures and devices are schematically shown in order to simplify the drawings.

In an organic light emitting device and a method of fabricating the same according to embodiments of the present invention, after a first substrate and a second substrate are assembled together, a second electrode in a light-emitting region of the second substrate does not directly contact the electrical connecting units of the first substrate. As a result, the second electrode and a light emitting layer covering the second electrode are not damaged during the substrate assembling process. Thin film transistors on the TFT substrate could be p-type metal oxide semiconductor (PMOS), n-type metal oxide semiconductor (NMOS) or complementary metal oxide semiconductor (CMOS) transistors. Fabrication of the thin film transistors could be performed by amorphous silicon or LTPS (low temperature polysilicon) technology.

Figure 2:
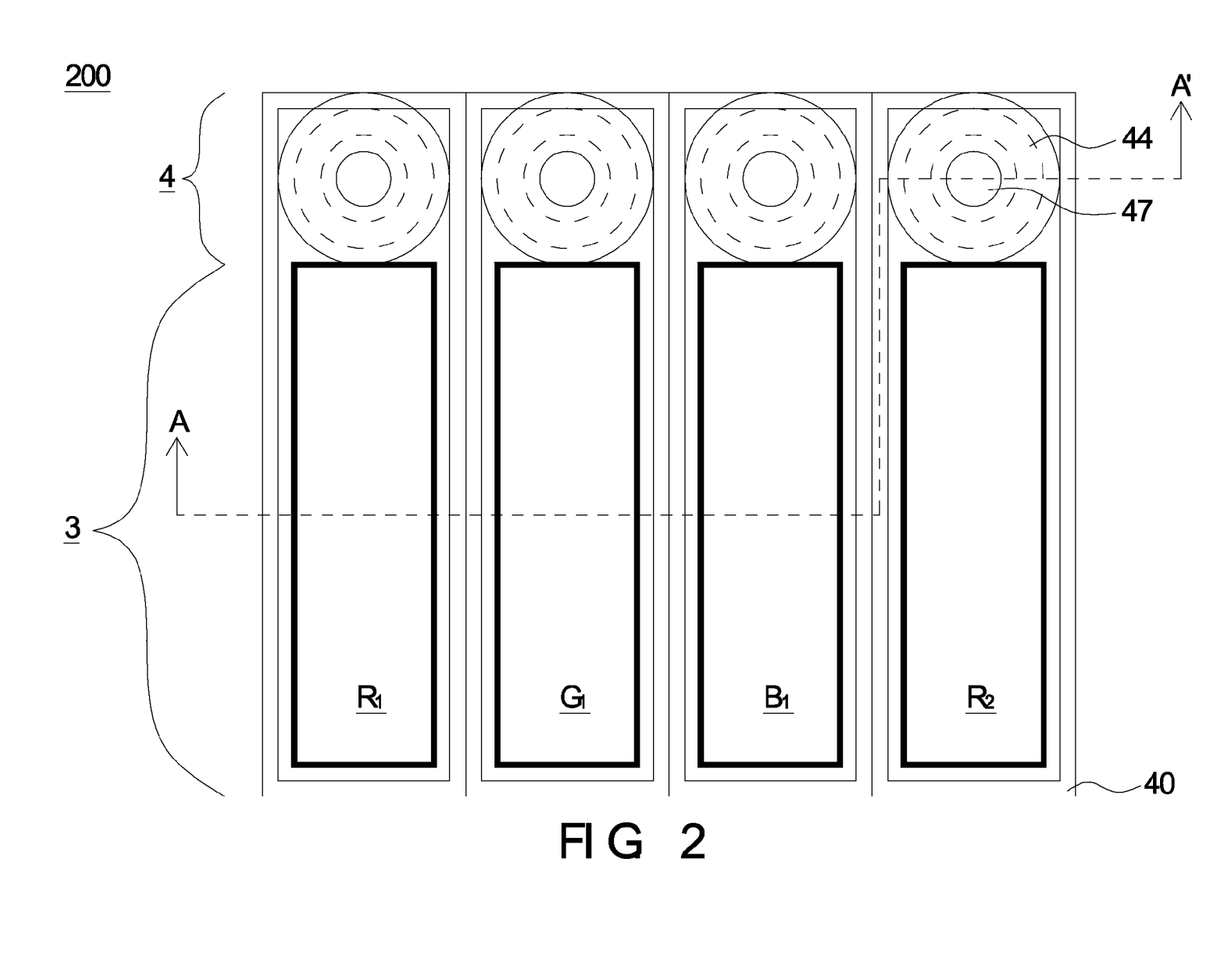
FIG. 2 is a top view of a pixel of an organic light emitting device according to an embodiment of the present invention.
Figure 3:
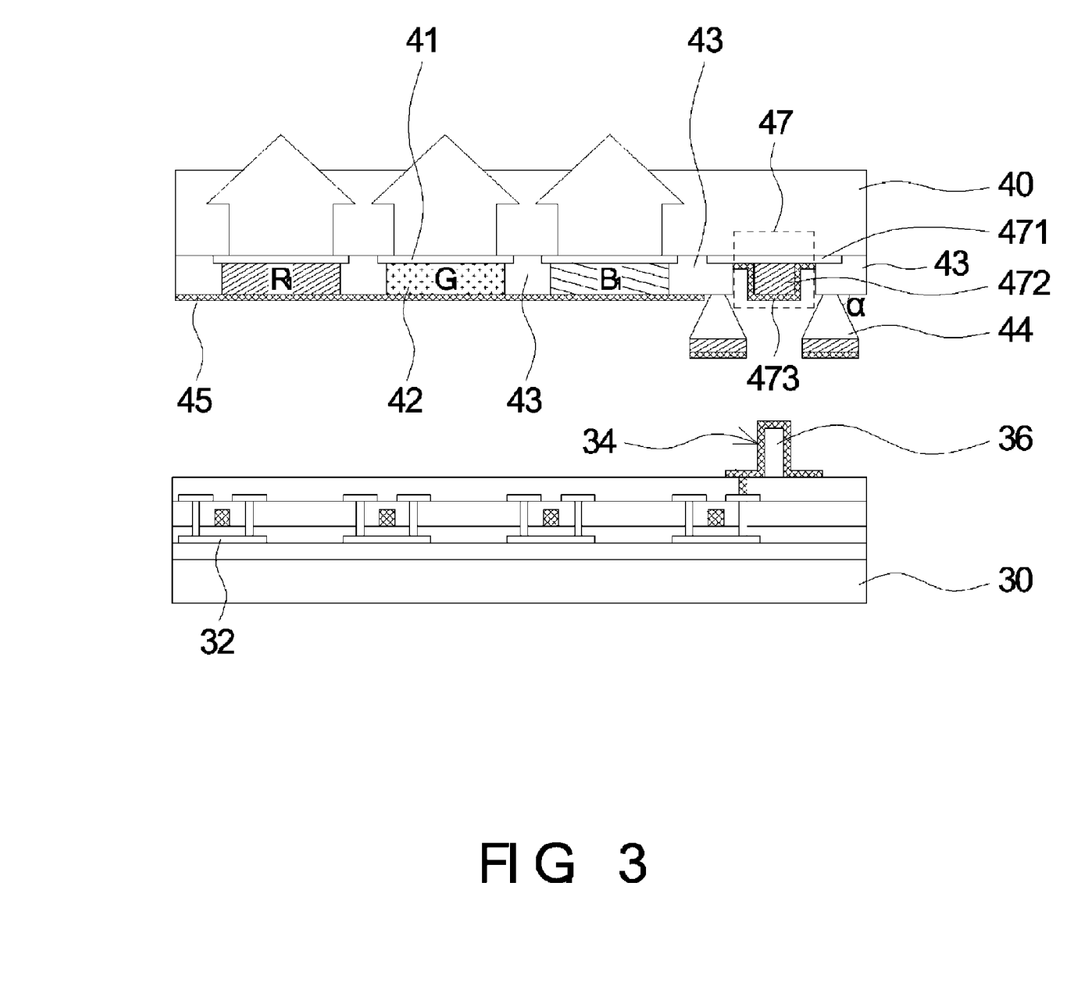
FIG. 3 is a cross-sectional, exploded view taken along line A-A' of FIG. 2.

FIG. 2 is a top view of a pixel of an organic light emitting device 200 according to an embodiment of the present invention. FIG. 3 is a cross-sectional, exploded view taken along line A-A' of FIG. 2. The organic light emitting device (OLED) 200 is formed by assembling a first substrate 30 and a second substrate 40. The device 200 includes one or more pixels. Each pixel (FIG. 2) includes one or more sub-pixels each of which, in turn, includes a light-emitting region 3 and a non light-emitting region 4. As shown in FIG. 2, each pixel in this embodiment includes four sub-pixels including a red light-emitting region (R1), a green light emitting region (G1), a blue light emitting region (B1) and another red light emitting region (R2). In each sub-pixel (R1, G1, B1 or R2), a barrier wall 44 is located in the non light-emitting region 4.

As shown in FIG. 3, several transistors and a first connecting electrode 34 are disposed on the first substrate 30. The transistors are electrically connected to each other and include switching transistors (not shown in drawings) and driver transistors 32. The first connecting electrode 34 is electrically connected to one of the transistors, such as a source or a drain of the driving transistor 32. Furthermore, the first connecting electrode 34 could be made of metal, metal alloy, metal oxide, metal adhesive, structure coated with a conductive metal layer or a conductive multilayer. In the present embodiment, a connecting body 36 (made of electrically conductive or nonconductive material) is enclosed by the first connecting electrode 34. The connecting body 36 protrudes from the first substrate 30 and projects towards the second substrate 40. Also, the connecting body 36 is positioned corresponding to a second connecting electrode 47 of the second substrate 40. After the two substrates are assembled together, the first connecting electrode 34 is electrically connected to the second connecting electrode 47 so as to electrically connect the transistors on the first substrate 30 and the respective sub-pixels of the second substrate 40. In an embodiment, after the two substrates are assembled together, the first connecting electrode 34 is in direct contact with the second connecting electrode 47.

It should be noted that the second connecting electrode 47 is disposed in the non light-emitting region 4 of the second substrate 40. In an embodiment, the second connecting electrode 47 includes a conductive multilayer (including a lower electrode 471 and an upper electrode 473) and an organic layer 472 enclosed by the conductive multilayer. The lower electrode 471 could be made of transparent conductive material, such as metal, metal alloy, and metal oxide. The organic layer 472 could be a single layer or a multilayer selected from the group consisting of a hole injection layer (HIL), a hole transport layer (HTL), an emitting layer (EL), an electron transport layer (ETL), an electron injection layer (EIL) and a carrier blocking layer. In practical application, the organic layer 472 and the light emitting layer 42 in the light-emitting region 3 could have the same structure. Moreover, the upper electrode 473 is preferably selected from the group consisting of aluminum (Al), calcium (Ca), magnesium (Mg), lithium/aluminum fluoride (LiF/Al) with a double-layer structure and other conductive materials. When the first substrate 30 and the second substrate 40 are assembled together, the second connecting electrode 47 is electrically connected to the respective first connecting electrode 34. As a result, the drain or the source of the driving transistor 32 of the first substrate 30 is electrically connected to the respective pixel electrode, such as first electrode 41, of the second substrate 40, for providing electrical signals to the light emitting device on the second substrate 40.

As shown in FIG. 3, a first electrode 41, a light emitting layer 42, an insulating layer 43, and a second electrode 45 are disposed in the light-emitting region 3 of each sub-pixel on the second substrate 40. The first electrode 41 could be made of transparent conductive materials, such as metal, metal alloy and metal oxide. The light emitting layer 42 may include light-emitting layers for emitting red light, green light and blue light. The light emitting layer 42 may include the organic light-emitting layer of the light emitting device and could comprise the layers selected from the group consisting of a hole injection layer (HIL), a hole transport layer (HTL), an emitting layer (EL), an electron transport layer (ETL), an electron injection layer (EIL) and a carrier blocking layer. The second electrode 45 could be made of aluminum (Al), calcium (Ca), magnesium (Mg), or a double-layer structure such as lithium/aluminum fluoride (LiF/Al), or other conductive materials. The insulating layer 43 electrically isolates the light emitting layers 42 and the first electrodes 41 of each subpixel from the adjacent sub-pixels. Furthermore, in the present embodiment, the barrier wall 44 is formed on the insulating layer 43 for enclosing the second connecting electrode 47, so that the second electrode 45 in the light emitting region 3 and the second connecting electrode 47 in the non light-emitting region 4 of the same subpixel are electrically isolated from each other. The insulating layer 43 disposed between the barrier wall 44 and the second substrate 40 increases the adhesion of the barrier wall 44 to the substrate 40. Alternatively, the barrier wall 44 can be formed directly on the second substrate 40. There is no particular limitation on the location of the barrier wall 44 in the present invention.

As discussed above, in each sub-pixel of the second substrate 40, the second connecting electrode 47 in the non light-emitting region 4, in accordance with an embodiment, includes a lower electrode 471, an organic layer 472 and an upper electrode 473. The lower electrode 471 is formed on the second substrate 40 and electrically connected to the first electrode 41 in the light-emitting region 3. The organic layer 472 is formed on the lower electrode 471. The upper electrode 473 covers the organic layer 472 and is electrically connected to the lower electrode 471. When the first substrate 30 and the second substrate 40 are assembled together, the first connecting electrode 34 protruding from the first substrate 30 and towards the second substrate 40 is electrically connected to the second connecting electrode 47 through, e.g., direct contact between the first connecting electrode 34 and the second connecting electrode 47. As a result, a driving signal is transmitted to the first electrode 41 of the respective subpixel on the second substrate 40 through the second connecting electrode 47.

In an embodiment suitable for practical fabrication, the lower electrode 471 in the non light-emitting region 4 and the first electrode 41 in the light-emitting region 3 of the second substrate 40 could be made of the same material. Similarly, the organic layer 472 in the non light-emitting region 4 and the light emitting layer 42 in the light-emitting region 3 could be made of the same material. Also, the upper electrode 473 and the second electrode 45 could be made of the same material.

Figure 4:
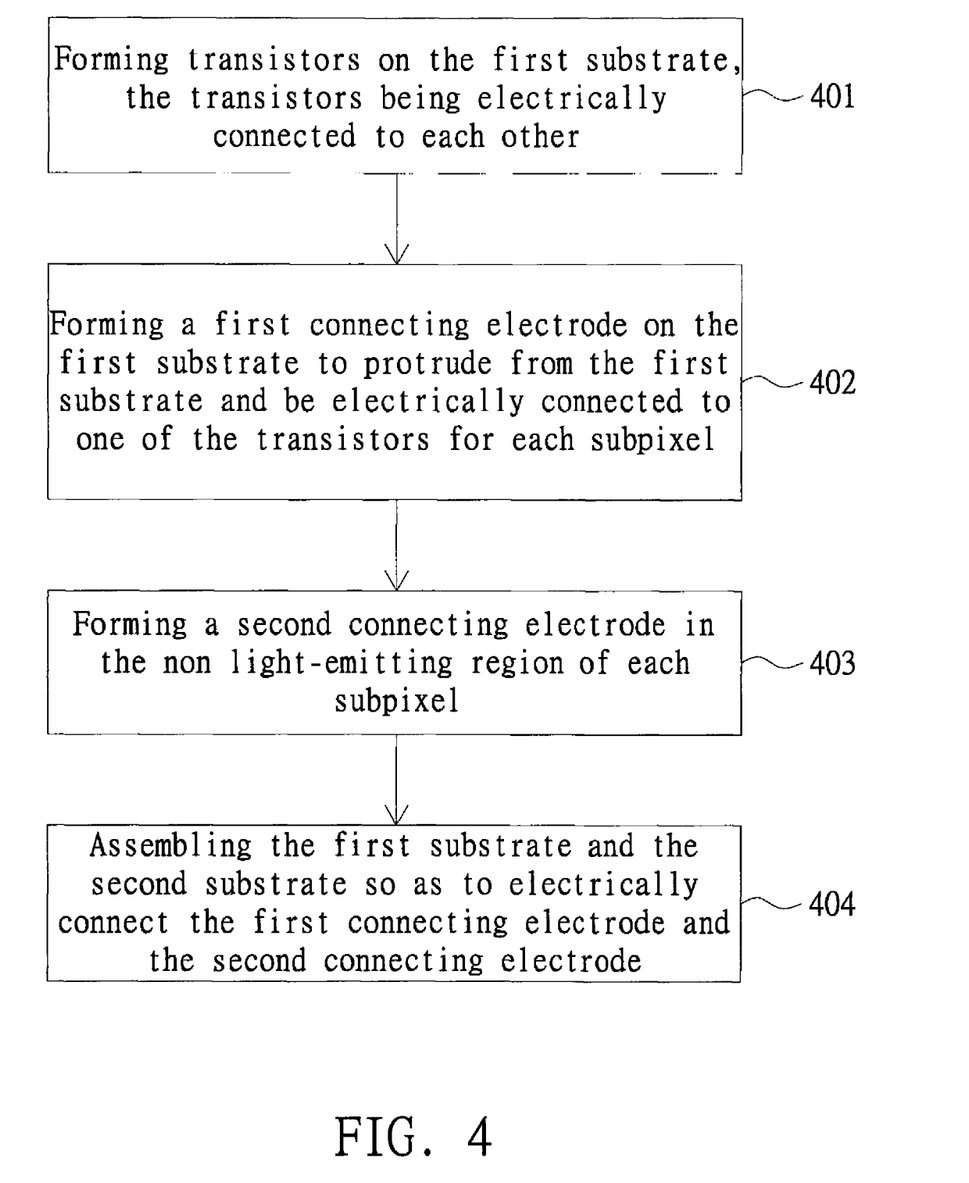
FIG. 4 is a flow chart of a method of fabricating the organic light emitting device according to an embodiment of the present invention.

FIG. 4 is a flow chart of a method of fabricating the organic light emitting device 200 according to an embodiment of the present invention. First, as shown in step 401, a first substrate 30 is provided, and several transistors (including driver transistors 32) are formed on the first substrate 30. The transistors are electrically connected to each other. Next, as shown in step 402, for each transistor used for transmitting signals to the second substrate 40, a first connecting electrode 34 is formed on the first substrate 30 and electrically connected to the transistor. The first connecting electrode 34 protrudes from the first substrate 30. Afterwards, as shown in step 403, the second substrate 40 including several sub-pixels is provided. Each sub-pixel includes a light-emitting region 3 and a non light-emitting region 4. A second connecting electrode 47 is formed in the non light-emitting region 4 of each subpixel. In an embodiment, the second connecting electrode 47 includes a conductive multilayer (including a lower electrode 471 and an upper electrode 473) and an organic layer 472 enclosed by the conductive multilayer. Later, as shown in step 404, the first substrate 30 and the second substrate 40 are assembled together so as to electrically connect each first connecting electrode 34 and the respective second connecting electrode 47.

In the step of fabricating the components on the second substrate 40, the lower electrode 471 in the non light-emitting region 4 and the first electrode 41 in the light-emitting region 3 could be formed at the same time and from the same material. Similarly, the organic layer 472 in the non light-emitting region 4 and the light emitting layer 42 in the light-emitting region 3 could be formed at the same time and from the same material. Additionally, the upper electrode 473 and the second electrode 45 could be formed at the same time and from the same material. In an embodiment where the organic layer 472 and the light emitting layer 42 have the same structure and are formed at the same time, when the emitting layer 42 is formed by evaporation using a mask, the mask need not cover the region of the second connecting electrode 47, and this process could be performed by one of the following methods:

(1) By forming the upper electrode 473 and the organic layer 472 from molecules that have different size and kinetic energy, so that the area in the region of the second connecting electrode 47 covered by the upper electrode 473 is larger than the area covered by the organic layer 472. In other words, the target of the upper electrode 473 is formed by smaller molecules with larger kinetic energy during the evaporation process, such that the edge of the upper electrode 473 is directly connected to the edge of the lower electrode 471 adjacent to the bottom of the barrier wall 44. As a result, the upper electrode 473 and the lower electrode 471 are directly contacted and electrically connected together. In operation, electric current flows to the lower electrode 471 from the upper electrode 473 accordingly.

(2) By positioning the evaporation source of the second electrode 45 and the upper electrode 473 closer to the second substrate 40 than the evaporation source of the organic layer 472 and the light emitting layer 42 during the evaporation process. As a result, the area of the organic layer 472 in the region of the second connecting electrode 47 is smaller than that of the upper electrode 473, so that it is easier to electrically connect the upper electrode 473 and the lower electrode 471.

(3) By forming the angle between the barrier wall 44 and the surface of the insulation layer 43 (or the horizontal plane or the surface of the second substrate) to be small, it is easy to electrically connect the upper electrode 473 and the lower electrode 471. The angle is preferably less than 70°, and more preferably between 40° and 60°, and most preferably between 55° and 60°.

When the second connecting electrode 47 does not include the organic layer 472, the mask, e.g., a metal mask, used for forming the organic light emitting layer 42 has to cover the connecting or non light-emitting region 4. Due to inherent inaccuracy of the positioning process and fabrication process of the metal mask, the metal mask has to cover a larger area than the connecting region 4. As a result, the light-emitting region 3 is reduced, and the aperture ratio is lowered greatly. This has a serious effect on the fabrication process (i.e. making the fabrication more difficult), and the cost of the metal mask increases significantly.

Therefore, a metal mask that does not cover the region of the second connecting electrode 47 is preferably used, and the second connecting electrode 47 is preferably formed by using one of the three methods described above. The area of the light-emitting region 3 does not need to be reduced, and driving signals from the first substrate 30 can be successfully transmitted to the respective subpixels on the second substrate 40. Hence, the organic light emitting device 200 has a high aperture ratio.

When the two substrates are assembled together, the first connecting electrode 34 contacts, preferably directly, the second connecting electrode 47 within the non light-emitting region 4. Therefore, the light emitting device in the light-emitting region 3 is not damaged according to embodiments of the invention. Additionally, the second connecting electrode 47 includes the organic layer 472, so that there is no need for the metal mask used for forming the light emitting layer 42 to cover the region of the second connecting electrode 47. Therefore, the OLED with a high aperture ratio could be obtained. As stated above, the organic light emitting device and the method of fabricating the same have high yield rate, high aperture ratio and high reliability.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of the invention.

What is claimed is:

1. An organic light emitting device (OLED), comprising:
a first substrate; and
a second substrate, opposing the first substrate and comprising a plurality of sub-pixels, each of the plurality of sub-pixel comprising a light emitting region and a non light-emitting region;
wherein the first substrate comprises
a plurality of transistors electrically connected to each other and corresponding to the plurality of sub-pixels of the second substrate, respectively; and
for each said sub-pixel, a first connecting electrode electrically connected to the respective one of the plurality of transistors; and
wherein the second substrate further comprises, for each said sub-pixel, a light-emitting layer which is formed in the light emitting region and a second connecting electrode which is formed in the non light-emitting region and which is electrically connected to the respective first connecting electrode, the second connecting electrode enclosing an organic layer, the organic layer in the non light-emitting region and the light-emitting layer in the light emitting region are made of the same material and have substantially the same thickness,
wherein the light-emitting region of each said sub-pixel of the second substrate comprises:
a first electrode formed on the second substrate;
the light-emitting layer formed on the first electrode; and
a second electrode formed on the light-emitting layer.

2. The device according to claim 1, wherein the transistors formed on the first substrate comprise a plurality of switching transistors and a plurality of driver transistors corresponding to the sub-pixels, respectively.

3. The device according to claim 2, wherein, for each said sub-pixel, the first connecting electrode is electrically connected to a source or a drain of the respective driver transistor.

4. The device according to claim 1, wherein in each said sub-pixel of the second substrate, the second connecting electrode in the non light-emitting region comprises:
a lower electrode formed on the second substrate and electrically connected to the first electrode in the light-emitting region;
the organic layer formed on the lower electrode; and
an upper electrode covering the organic layer and directly contacting and electrically connected to the lower electrode.

5. The device according to claim 4, wherein the lower electrode in the non light-emitting region of each said sub-pixel of the second substrate is made of the same material as the first electrode in the light-emitting region.

6. The device according to claim 4, wherein the upper electrode in the non light-emitting region of each said sub-pixel of the second substrate is made of the same material as the second electrode in the light-emitting region.

7. The device according to claim 1, further comprising a barrier wall formed in the non light-emitting region of each said sub-pixel of the second substrate for enclosing the second connecting electrode.

8. A method of fabricating an organic light emitting device from first and second substrates wherein the second substrate comprises a plurality of sub-pixels, and the first substrate comprises a plurality of transistors electrically connected to each other and corresponding to the sub-pixels of the second substrate, respectively, the method comprising:
for each said sub-pixel, forming a first connecting electrode on the first substrate and electrically connecting the first connecting electrode to the respective one of the transistors;
defining in each said sub-pixel a light-emitting region and a non light-emitting region;
forming in each said sub-pixel a lower electrode in the non light-emitting region and a first electrode in the light-emitting region of the second substrate, wherein the forming in each said sub-pixel the lower electrode in the non light-emitting region comprises electrically connecting the lower electrode and the first electrode in the light-emitting region;
forming in each said sub-pixel an organic layer on the lower electrode and a light-emitting layer on the first electrode at the same time, wherein the forming in each said sub-pixel the organic layer on the lower electrode comprises directly contacting and electrically connecting the upper electrode and the lower electrode;
forming in each said sub-pixel an upper electrode on the organic layer and a second electrode on the light-emitting layer; and
assembling the first substrate and the second substrate together so as to directly contact and electrically connect the first connecting electrode with the respective upper electrode.

9. The method according to claim 8, wherein the transistors formed on the first substrate comprise a plurality of switching transistors and a plurality of driver transistors corresponding to the sub-pixels, respectively.

10. The method according to claim 9, wherein the step of electrically connecting the first connecting electrode to the respective one of the transistors comprises electrically connecting the first connecting electrode to a source or a drain of the respective driver transistor.

11. An organic light emitting device (OLED) formed by assembling a first substrate and a second substrate, the device comprising a plurality of sub-pixels, each sub-pixel comprising a light-emitting region and a non light-emitting region, the light-emitting region comprising a light emitting layer formed on the second substrate, the non light-emitting region comprising:
a first connecting electrode formed on the first substrate and projecting towards the second substrate; and
a second connecting electrode formed on the second substrate and comprising a conductive multilayer and an organic layer enclosed by the conductive multilayer, and the light-emitting layer in the light-emitting region and the organic layer in the non light-emitting region are made of the same material and formed at the same time to have substantially the same thickness;
wherein the second connecting electrode is in direct contact with and electrically connected to the first connecting electrode so as to electrically connect the first substrate and the second substrate,
wherein the conductive multilayer comprises a lower electrode and an upper electrode, the lower electrode is formed on the second substrate, and the organic layer is formed on the lower electrode, and the upper electrode covers the organic layer and is in direct contact with and electrically connected to the lower electrode.

12. The device according to claim 11, wherein each said sub-pixel in the light-emitting region thereof comprises a first electrode, the light emitting layer over the first electrode and a second electrode over the light-emitting layer.

13. The device according to claim 11, further comprising a barrier wall formed in the non light-emitting region of each said sub-pixel of the second substrate for enclosing the second connecting electrode.

* * * * *